United States Patent [19]

Mizushima et al.

[11] Patent Number: 5,109,358
[45] Date of Patent: Apr. 28, 1992

[54] OPTICAL FLIP-FLOP CIRCUIT

[75] Inventors: Yoshihiko Mizushima; Kazutoshi Nakajima; Toru Hirohata; Takashi Iida; Yoshihisa Warashina; Kenichi Sugimoto; Hirofumi Kan, all of Shizuoka, Japan

[73] Assignee: Hamamatsu Photonics Kabushiki Kaisha, Shizuoka, Japan

[21] Appl. No.: 423,203

[22] Filed: Oct. 17, 1989

[30] Foreign Application Priority Data

Jan. 19, 1989 [JP] Japan .................................. 1-10256

[51] Int. Cl.$^5$ .......................... G11C 7/00; H01J 40/14
[52] U.S. Cl. ...................................... 365/154; 365/64; 365/73; 365/112; 365/215; 250/214 DC; 250/213 A
[58] Field of Search ...................... 365/73, 76, 77, 109, 365/110, 112, 149, 154, 215, 64; 250/214 DC, 213 A, 568; 307/129, 311

[56] References Cited

U.S. PATENT DOCUMENTS

| | | | |
|---|---|---|---|
| 3,165,721 | 12/1962 | Kennedy et al. | 365/73 |
| 3,289,171 | 11/1966 | Scherr et al. | 365/73 |
| 3,631,411 | 12/1971 | Kosonocky | 365/115 |
| 4,277,755 | 7/1981 | Fausone et al. | 307/311 |
| 4,300,211 | 11/1981 | Hudson | 365/215 |
| 4,588,896 | 5/1986 | Abbas | 250/213 |

FOREIGN PATENT DOCUMENTS 2185165  12/1986  United Kingdom ............... 365/109

Primary Examiner—Stuart N. Hecker
Assistant Examiner—Jack A. Lane
Attorney, Agent, or Firm—Finnegan, Henderson, Farabow, Garrett and Dunner

[57] ABSTRACT

An optical flip-flop circuit which includes an electrical power source for providing an electrical signal, a light-receiving element provided in series with the power source for switching the electrical signal in response to an optical signal, a light-emitting element for emitting the optical signal in response to the electric signal, an electrical signal path between the light-receiving element and the light-emitting element, whereby the electrical signal passes from the power source to the light-emitting element in response to the optical signal received by the light-receiving element, a light path for directing the optical signal from the light-emitting element to the light-receiving element, wherein the light path and the electrical signal path form a signal loop through which a signal circulates, said circulating signal comprising the electrical signal through the electrical signal path portion of the signal loop and the optical signal through the light path portion of the signal loop, and input/output means for providing an input optical signal to the light-receiving element and for emitting a portion of the optical signal directed by the light path.

8 Claims, 2 Drawing Sheets

OPTICAL FLIP-FLOP CIRCUIT

BACKGROUND OF THE INVENTION

The present invention relates to an optical flip-flop circuit that receives and produces an optical signal and operates in such a way as to hold a binary state by assuming one of two possible states, 1 for a set state and Flip-flop circuits known today that are capable of operating on digital signals are limited to those based on electronic circuits.

Optical computers which once were a mere interest in laboratories have recently evolved into the stage where the prospects of using them in commercial applications are not far into the future, and this has necessitated the development of flip-flops, latch memories and other optical memory circuits that are capable of performing various logic operations in response to the reception of optical signals. However, with the state of the art, it has been very difficult to have conventional electronic circuits operate in response to optical signals without suffering from the disadvantage of increased complexity in circuit configurations.

SUMMARY OF THE INVENTION

An object, therefore, of the present invention is to provide a device that is capable of operating on optical signals alone including not only control signals but also input and output signals.

This object can be attained by an optical flip-flop circuit comprising a light-receiving element, a light-emitting element, an electric conductor path over which an electric signal based on the optical signal received by said light-receiving element is conducted to said light-emitting element, a light guiding path over which an optical signal based on the electric signal supplied to said light-emitting element via said electric conductor path is guided to said light-receiving element, and an optical input/output section which supplies an input optical signal to said light-receiving element while picking up an output optical signal produced from said light-emitting element.

When the input optical signal coming from the optical input/output section reaches the light-receiving element, the latter sends out the electric signal which travels over the electric conductor path to reach the light-emitting element. The light-emitting element then radiated light and the resulting optical signal is sent to the light-receiving element via the optical conductor path. The signal continues to be held through the feedback loop described above (provided that a wideband amplifier may be inserted in the electric conductor path as required). With the signal being held in this way, the optical signal produced from the light-emitting element can be picked up from the optical input/output section. Stated more specifically, the circuit is set by reception of the optical signal and the optical signal that has been held in the circuit can be picked up from the optical input/output section.

DETAILED DESCRIPTION OF THE PREFERRED EMBODIMENTS

Figure 1:
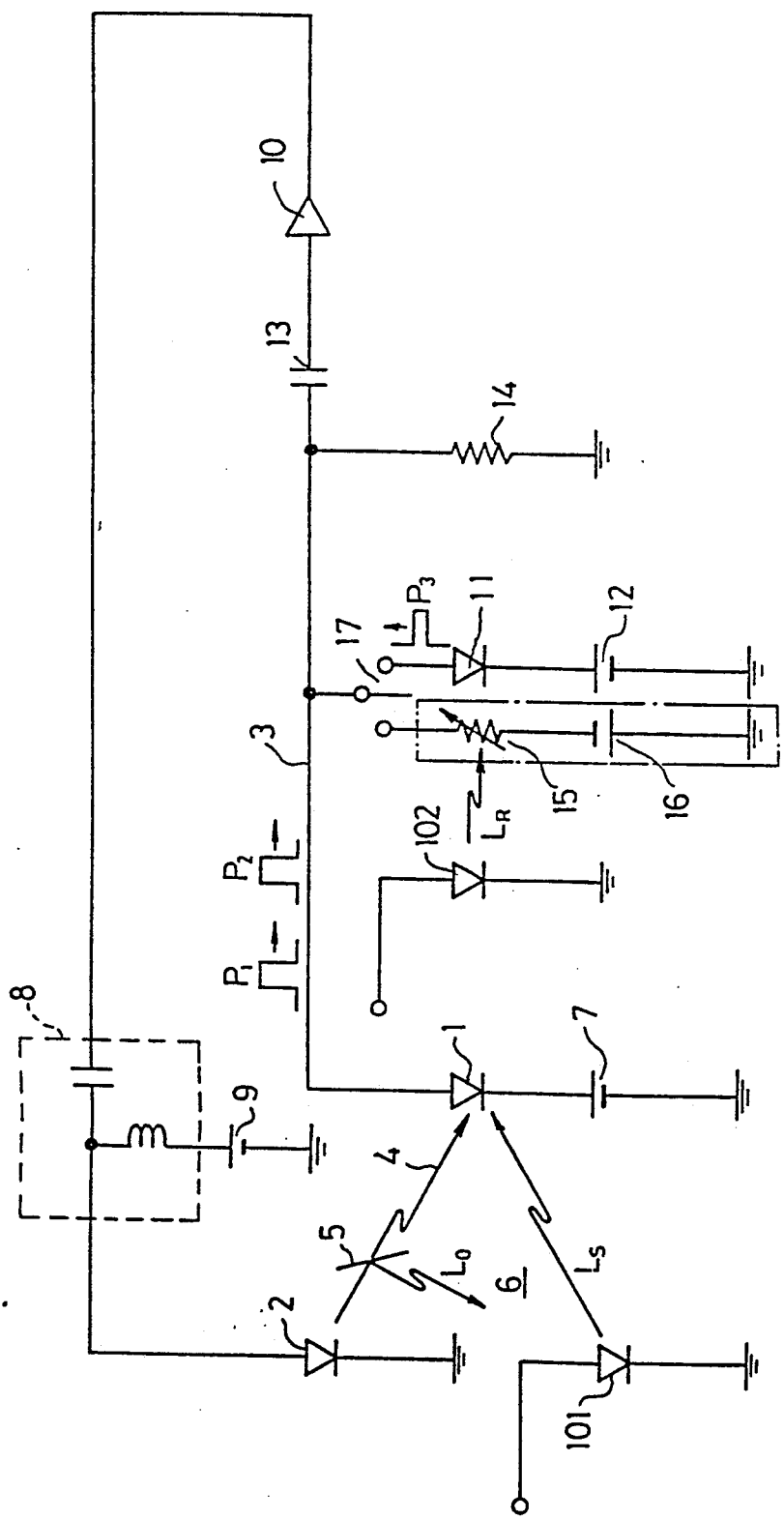
FIG. 1 is a circuit diagram showing an optical flip-flop circuit according to an embodiment of the present invention.

FIG. 1 is a circuit diagram of an optical flip-flop circuit according to an embodiment of the present invention. Shown by numeral 1 is a light-receiving element and 2 is a light-emitting element. An electric signal produced from the light-receiving element 1 is sent to the light-emitting element 2 over an electric conductor path 3 such as an electric cable or a strip line. Upon receiving the electric signal, the light-emitting element 2 produces an optical signal which travels through a light guiding path 4 such as an optical fiber, a lens or a photoconducting path to reach the light-receiving element 1. The light-receiving element 1 is also supplied with an optical (pulse) signal from a light-emitting element 101. A half mirror 5 is provided so that the optical signal from the light-emitting element 2 can be picked up by an external circuit. The light-emitting element 101 and half mirror 5 make up an optical input/output section 6.

Assume here that the circuit having the composition described above is in the initial state. When the light-emitting element 101 produces an optical signal, it travels through the optical input/output port 6 to reach the light-receiving element 1. As a result, the light-receiving element 1 produces an electric signal $P_1$ which travels over the electric conductor path 3 to reach the light-emitting element 2. The element 2 then emits an optical signal which is sent to the light-receiving element 1 via the optical conductor path 4. Upon receiving the optical signal, the light-emitting element 1 converts it to an electric signal. In order to ensure that the loop described above will have a gain of more than unity, an amplifier may be inserted as required. At the same time, the half mirror 5 in the optical input/output port 6 allows part of the optical signal from the light-emitting element 2 to be picked up by an external circuit. Thus, the above-described circuit configuration realizes a basic optical flip-flop circuit capable of operating on both an input and an output optical signal.

Examples of devices that may be used as the light-receiving element 1 are a photodiode, a photomultiplier tube, a photoconductive element, and an avalanche photodiode. Examples of devices that may be used as the light-emitting element 2 include a light-emitting diode and a laser diode. If a photomultiplier tube, a photoconductive element or an avalanche photodiode is used as the light-receiving element 1, the internal amplifying action provides an increased loop gain and ON-/OFF ratio, thereby contributing to a stable flip-flop operation on signals. The light-receiving element 1 is connected to a power source 7 which supplies a predetermined bias voltage.

There is provided at a position in the electric conductor path 3 located before the light-emitting element 2 a bias block 8 composed of a capacitor and a coil, and a power source 9 connected to said bias block supplies a predetermined positive voltage to the light-emitting element 2. As means for preventing signal attenuation, an amplifier circuit 10 typically composed of an FET is inserted in the electric conductor path 3 so that signal attenuation will not lead to a reduction in the quantity of light emission from the element 2. A load resistance 14 is inserted in front of the amplifier circuit 10.

With the composition described above, the light-receiving element 1, when receiving an optical signal from the light-emitting element 101, sends out an electric signal $P_1$ which is amplified by the amplifier circuit 10 and supplied to the light-emitting element 2. Upon receiving the optical signal from the element 2, the light-receiving element 1 sends out an electric signal $P_2$. Thus, the circuit is in a state where it is capable of holding signals continuously.

According to another embodiment of the present invention, reset means is provided in the optical flip-flop circuit described above so as to make a flip-flop with a reset terminal. Needless to say, it would be quite easy for one skilled in the art to effect resetting by supplying an electric signal, so the following discussion is limited to optical resetting.

A first method for effecting optical resetting is to connect a light receiving element 11 to the electric conductor path 3, with a power source 12 being provided to supply the conductor path 3 with a voltage of the same polarity (positive) as that of the electric signal produced from the light-receiving element 1. A capacitor 13 is provided in the conductor path 3 at a point closer to the amplifier 10 than the junction between the light-receiving element 11 and the conductor path 3. A load resistance 14 is connected between said capacitor and the ground. A light-emitting element 102 is also provided for supplying an optical reset signal to the light-receiving element 11.

If the circuit having this configuration is to be reset after it has been brought to a set state with an optical signal supplied from the light-emitting element 101, an optical reset signal is produced from the light-emitting element 102. The light-receiving element 11 then turns on and the power source 12 supplies an electric signal $P_3$ to the conductor path 3. Since the electric signal $P_3$ saturates the capacitor 13, the electric signal from the light-receiving element 1 is attenuated, thus eventually reducing the level of the signal being supplied to the amplifier circuit 10. As a result, the loop gain is reduced and the light emission from the element 2 becomes so small as to reset the circuit to the initial state. In other words, the light-receiving element 11 and the power source 12 make up a saturating charge sending section that saturates the capacitor 13.

An optical flip-flop circuit having a reset capability may be constructed by another method. That is, the reset means comprising the capacitor 13, light-receiving element 11 and power source 12 is replaced by reset means connected to the conductor path 3 that is enclosed with a one-short-and-one-long dashed line in FIG. 1 and which comprises a light-receiving element 15 such as a photoconductive element whose resistance decreases upon receipt of an optical signal and a power source 16 that supplies a negative voltage to the conductor path 3 via said light-receiving element 15. With this circuit configuration, too, if one wants to reset the circuit after it has been brought to a set state with an optical signal supplied from the light-emitting element 101, an optical reset signal is produced from the light-emitting element 102. As a result, the resistance of the light-receiving element 15 decreases and the power source 16 supplies a negative voltage to the conductor path 3. The supplied negative voltage acts to cancel the electric signal from the light-receiving element 1, thus attenuating the electric signal flowing in the circuit, which then returns to the initial state. Effective reset means can also be constructed without using the power source 16 and, in this case, the electric signal from the light-receiving element 1 is allowed to flow to the ground in response to an optical reset signal.

Either one of the two reset means described above will suffice for the purposes of the present invention. Therefore, the switch 17 shown in FIG. 1 is not a real component and is merely intended to show that either one of the reset means provided by the methods described above is selectively adopted. An arrangement corresponding to the optical input/output section 6 provided between the light-emitting element 101 and the light-receiving element 1 is also provided between the light-emitting element 102 and the light-receiving element 11 or 15.

Figure 2:
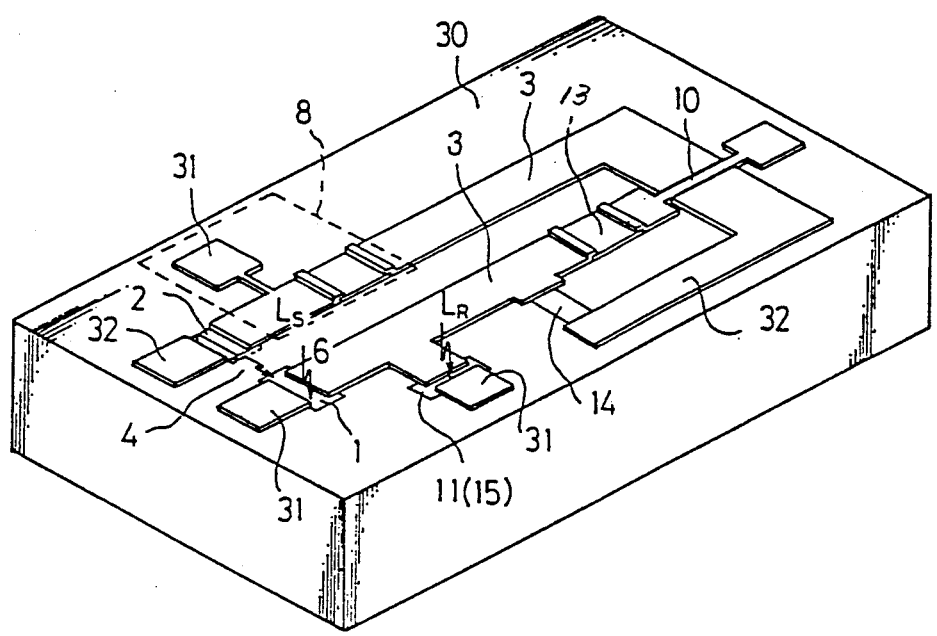
FIG. 2 is a perspective view showing a device in which the flip-flop circuit of FIG. 1 is integrated monolithically.

FIG. 2 is a perspective view of a device in which the optical flip-flop circuit shown in FIG. 1 and its peripheral circuits are integrated monolithically on a substrate of a semiconductor such as silicon (Si) or gallium arsenide (GaAs). The components which correspond to those shown in FIG. 1 are identified by like numerals. The components which correspond to the light-emitting elements 101 and 102 are not integrated in this device. Shown by numeral 30 is the exposed area of the substrate surface and is covered with an electrically insulating layer. Shown by 31 is a pad to which a bias voltage or other voltages are to be applied, and the power sources 7, 9 and 12 (or 16) are connected to this pad. Shown by 32 is a pad for providing the ground level. The load resistance 14 is a resistance. The amplifier circuit 10 is configured as an FET and may be fabricated together with the inductance (L), capacitance (C), resistance (R) and diodes in the circuit by commonly employed semiconductor integrating techniques including the diffusion of impurities and ion implantation. The bias block 8 has an LC coupling structure and is composed of an inductor in the form of a linear conductor and an MIM capacitor. The light guiding path 4 may have the half mirror 5 embedded in a material that will not attenuate an optical signal or the half mirror 5 may be held by some means and remain exposed to air atmosphere. Since the half mirror is not an indispensable component, it may be omitted and, instead, a semiconductor laser is used as the light-emitting element 2 and the duplex emission of laser light is utilized in such a way that light emitted in one direction is fed to the light-receiving element 1 whereas light emitted in the other direction is picked up by an external circuit. Needless to say, the light guiding path 4 may be composed of an optical fiber.

As will be understood from the explanation made in association with FIG. 1, the flip-flop memory circuit described above is brought to a set state when an optical set signal $L_S$ is emitted from a light-emitting element (not shown but corresponding to the light-emitting element 101 in FIG. 1) and launched from the optical input/output port 6 toward the light-receiving element 1. If, on the other hand, an optical reset signal $L_R$ is emitted from another light-emitting element (not shown but corresponding to the light-emitting element 102 in FIG. 1) and launched to the light receiving element 11 (or 15), the circuit is initialized (reset) as is apparent from the description of FIG. 1.

Besides the reset means described in connection with the embodiments shown in FIG. 1, there still is another method for effecting resetting and this comprises adding to the electric conductor path 3 a configuration that provides the electric signal PI with a higher-than-normal attenuation when an optical reset signal is supplied, for example, a configuration that allows the electric signal to be shunted to flow in a high-attenuation path upon switching.

Figure 3:
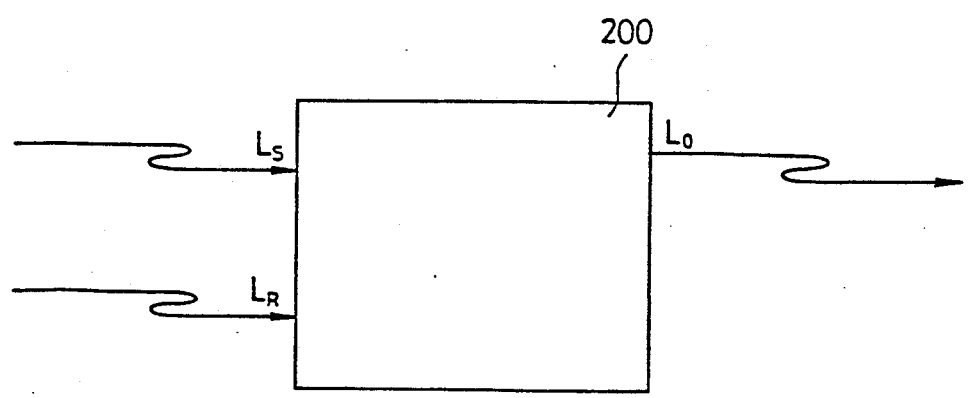
FIG. 3 is a block diagram showing the concept of the circuit of FIG. 1 which works as a flip-flop on an input and an output optical signal.

In any event, the optical flip-flop circuit according to the embodiments under discussion may conceptually be regarded as a circuit which, as generally indicated by 200 in FIG. 3, receives an optical set signal $L_s$ and an optical reset signal $L_R$ as input signals and produces the output light from the half mirror 5 as an output optical signal $L_o$. When the optical signals $L_s$ and $L_R$ are supplied in pulse form, the circuit will operate as an optical flip-flop and can be used as a 1-bit latch memory.

The embodiments under discussion are not so designed as to permit an electric signal to be picked up from the electric conductor path 3. If desired, a pickup circuit may be provided on an appropriate position so as to obtain a useful signal.

The light-receiving elements 1 and 11 may be so configured that the two cathodes of photodiodes are connected together to reduce the amount of dark current flowing in two directions. Not only is this configuration effective for providing stable operating performance but it also is simpler and more adapted for integration purposes than a circuit using transistors and other electronic devices.

As described on the foregoing pages, in the optical flip-flop circuit of the present invention, an optical signal supplied to the light-receiving element is held by being transmitted through a closed loop starting with said light-receiving element, followed by an electric conductor path, a light-emitting element and an optical conductor path and ending with said light-receiving element. At the same time, the optical signal from the light-emitting element can be picked up from the optical input/output section. This offers the advantages that logic operations can be performed in response to light reception to realize inputting and outputting of optical signals as well as signal storage and yet the circuit configuration required is very simple.

What is claimed is:

1. An optical flip-flop circuit comprising:
    an electrical power source for providing an electrical signal having a predetermined voltage potential;
    a light-receiving element in series with the electrical power source for switching the electrical signal in response to an optical signal;
    a light-emitting element for emitting the optical signal in response to the electrical signal;
    an electrical signal path connecting the light-receiving element and the light-emitting element, whereby the electrical signal passes from the electrical power source to the light-emitting element in response to the optical signal received by the light-receiving element;
    a light path for directing the optical signal from the light-emitting element to the light-receiving element, wherein the light path and the electrical signal path form a signal loop through which a signal circulates, the circulating signal comprising the electrical signal through the electrical signal path portion of the signal loop and the optical signal through the light path portion of the signal loop;
    input/output means for providing an input optical signal to the light-receiving element to set the optical flip-flop circuit, and for emitting a portion of the optical signal directed by the light path such that the state of the optical flip-flop circuit is indicated; and
    reset means for resetting the optical flip-flop circuit comprising:
    a reset light-emitting element for emitting an optical reset signal;
    a rest power source for providing a reset electrical signal having a voltage potential the same as the predetermined voltage potential of the electrical signal;
    a reset light-receiving element connected between the electrical signal path and the reset power source, wherein the light-receiving element acts as a switch in response to the reset optical signal; and,
    a capacitor provided in the electrical signal path, wherein the voltage potential of the reset electrical signal saturates the capacitor when switched to the electrical signal path in response to the optical reset signal, such that the electrical signal may not pass from the electrical power source to the light-emitting element.

2. The optical flip-flop circuit according to claim 1 further comprising amplifying means provided in the electrical signal path for amplifying the electrical signal such that the gain of the circulating signal through the signal loop is at least one.

3. The optical flip-flop circuit according to claim 1, wherein the input/output means comprises a light splitting means provided in the light path for redirecting a portion of the optical signal from the light path to an external circuit.

4. The optical flip-flop circuit according to claim 1, further comprising a bias means in the electrical path for providing a predetermined bias voltage to the light-emitting element in response to the electrical signal.

5. The optical flip-flop circuit according to claim 4, wherein the bias means comprises; a bias capacitor, a coil, and a bias power supply.

6. The optical flip-flop circuit according to claim 1, wherein the input/output section comprises a light splitting means provided in the light path for redirecting a portion of the optical signal from the light path to an external circuit.

7. The optical flip-flop circuit according to cl aim 1, further comprising a bias means in the electrical signal path for providing a predetermined bias voltage to the light-emitting element in response to the electrical signal.

8. The optical flip-flop circuit according to claim 7, wherein the bias means comprises; a capacitor, a coil, and a bias power supply.

* * * * *

UNITED STATES PATENT AND TRADEMARK OFFICE
CERTIFICATE OF CORRECTION

PATENT NO. : 5,109,358
DATED : April 28, 1992
INVENTOR(S) : Yoshihiko Mizushima et al.

It is certified that error appears in the above-identified patent and that said Letters Patent is hereby corrected as shown below:

Claim 1, column 6, line 14, change "rest" to --reset--.

Claim 5, column 6, line 45, delete ";".

Claim 8, column 6, line 58, delete ";".

Signed and Sealed this

Fifth Day of October, 1993

*Attest:*

BRUCE LEHMAN

*Attesting Officer*   *Commissioner of Patents and Trademarks*